(12) United States Patent
Tanoue

(10) Patent No.: US 11,962,090 B2
(45) Date of Patent: Apr. 16, 2024

(54) RADIO FREQUENCY MODULE AND COMMUNICATION APPARATUS

(71) Applicant: Murata Manufacturing Co., Ltd., Kyoto (JP)

(72) Inventor: Yuudai Tanoue, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 286 days.

(21) Appl. No.: 17/488,382

(22) Filed: Sep. 29, 2021

(65) Prior Publication Data

US 2022/0021126 A1 Jan. 20, 2022

Related U.S. Application Data

(63) Continuation of application No. PCT/JP2020/022655, filed on Jun. 9, 2020.

(30) Foreign Application Priority Data

Jul. 3, 2019 (JP) .................................. 2019-124842

(51) Int. Cl.
*H01Q 21/06* (2006.01)
*H01Q 1/20* (2006.01)
(Continued)

(52) U.S. Cl.
CPC .............. *H01Q 21/06* (2013.01); *H01Q 1/20* (2013.01); *H04B 1/04* (2013.01); *H04B 1/1615* (2013.01); *H04B 2001/0408* (2013.01)

(58) Field of Classification Search
CPC .......... H01Q 21/06; H01Q 1/20; H01Q 5/335; H04B 1/04; H04B 1/1615; H04B 2001/0408
See application file for complete search history.

(56) References Cited

U.S. PATENT DOCUMENTS

2006/0146484 A1 7/2006 Kim et al.
2019/0173167 A1* 6/2019 Ariumi .................. H01Q 23/00
(Continued)

FOREIGN PATENT DOCUMENTS

JP 2006-190964 A 7/2006
JP 2007-158158 A 6/2007
(Continued)

OTHER PUBLICATIONS

International Search Report issued in Application No. PCT/JP2020/022655, dated Sep. 1, 2020.

*Primary Examiner* — Hoang V Nguyen
(74) *Attorney, Agent, or Firm* — Pearne & Gordon LLP

(57) ABSTRACT

A change in potential at a ground terminal is suppressed. A radio frequency module includes a mount board, a first circuit element, a second circuit element, a signal terminal (an antenna terminal, a signal input terminal, or a signal output terminal) for a radio frequency signal, and a block terminal. The mount board has a first principal surface and a second principal surface facing each other. The first circuit element is mounted on the first principal surface of the mount board. The second circuit element is mounted on the second principal surface of the mount board. The signal terminal (the antenna terminal, the signal input terminal, or the signal output terminal) is disposed on the second principal surface of the mount board. The block terminal is disposed on the second principal surface of the mount board. The block terminal includes a plurality of ground terminals.

16 Claims, 5 Drawing Sheets

(51) Int. Cl.
*H04B 1/04* (2006.01)
*H04B 1/16* (2006.01)

(56) References Cited

U.S. PATENT DOCUMENTS

| | | |
|---|---|---|
| 2019/0214355 A1 | 7/2019 | Nishikawa |
| 2019/0289758 A1 | 9/2019 | Furuya |
| 2020/0203288 A1 | 6/2020 | Otsubo et al. |
| 2020/0212951 A1 | 7/2020 | Hanaoka |

FOREIGN PATENT DOCUMENTS

| | | | |
|---|---|---|---|
| WO | 2018/110393 A1 | 6/2018 | |
| WO | 2018/110397 A1 | 6/2018 | |
| WO | WO-2018168653 A1 * | 9/2018 | ............. H01L 23/12 |
| WO | 2019/045088 A1 | 3/2019 | |
| WO | 2019054154 A1 | 3/2019 | |

* cited by examiner

RADIO FREQUENCY MODULE AND COMMUNICATION APPARATUS

CROSS REFERENCE TO RELATED APPLICATION

This is a continuation of International Application No. PCT/JP2020/022655 filed on Jun. 9, 2020 which claims priority from Japanese Patent Application No. 2019-124842 filed on Jul. 3, 2019. The contents of these applications are incorporated herein by reference in their entireties.

BACKGROUND OF THE DISCLOSURE

Field of the Disclosure

The present disclosure relates generally to a radio frequency module and a communication apparatus, and more particularly to a radio frequency module including a mount board and a communication apparatus including the radio frequency module.

Description of the Related Art

In the related art, a front-end module including a substrate (mount board), a filter unit disposed on the substrate, and a switch IC disposed on the substrate and having an amplifier is known as a radio frequency module (see, for example, Patent Document 1).

In an example of the front-end module disclosed in Patent Document 1, the filter unit is disposed on one of the principal surfaces of the substrate, and the switch IC is disposed on the other principal surface of the substrate.

The front-end module also includes a plurality of electrodes disposed on the other principal surface of the substrate.

Patent Document 1 also discloses a communication apparatus including an RF signal processing circuit that processes a radio frequency signal transmitted and received by an antenna element, and the front-end module.

Patent Document 1: International Publication No. 2018/110393

BRIEF SUMMARY OF THE DISCLOSURE

In a radio frequency module, electrical characteristics sometimes become unstable because of a change in potential at a ground terminal.

It is an object of the present disclosure to provide a radio frequency module and a communication apparatus that are capable of suppressing a change in potential at a ground terminal.

A radio frequency module according to an aspect of the present disclosure includes a mount board, a first circuit element, a second circuit element, a signal terminal for a radio frequency signal, and a block terminal. The mount board has a first principal surface and a second principal surface facing each other. The first circuit element is mounted on the first principal surface of the mount board. The second circuit element is mounted on the second principal surface of the mount board. The signal terminal is disposed on the second principal surface of the mount board. The block terminal is disposed on the second principal surface of the mount board. The block terminal includes a plurality of ground terminals.

A communication apparatus according to an aspect of the present disclosure includes the radio frequency module, and a signal processing circuit. The signal processing circuit performs signal processing on the radio frequency signal.

The radio frequency module and the communication apparatus according to the above aspects of the present disclosure are capable of suppressing a change in potential at the ground terminals.

DETAILED DESCRIPTION OF THE DISCLOSURE

Figure 1:
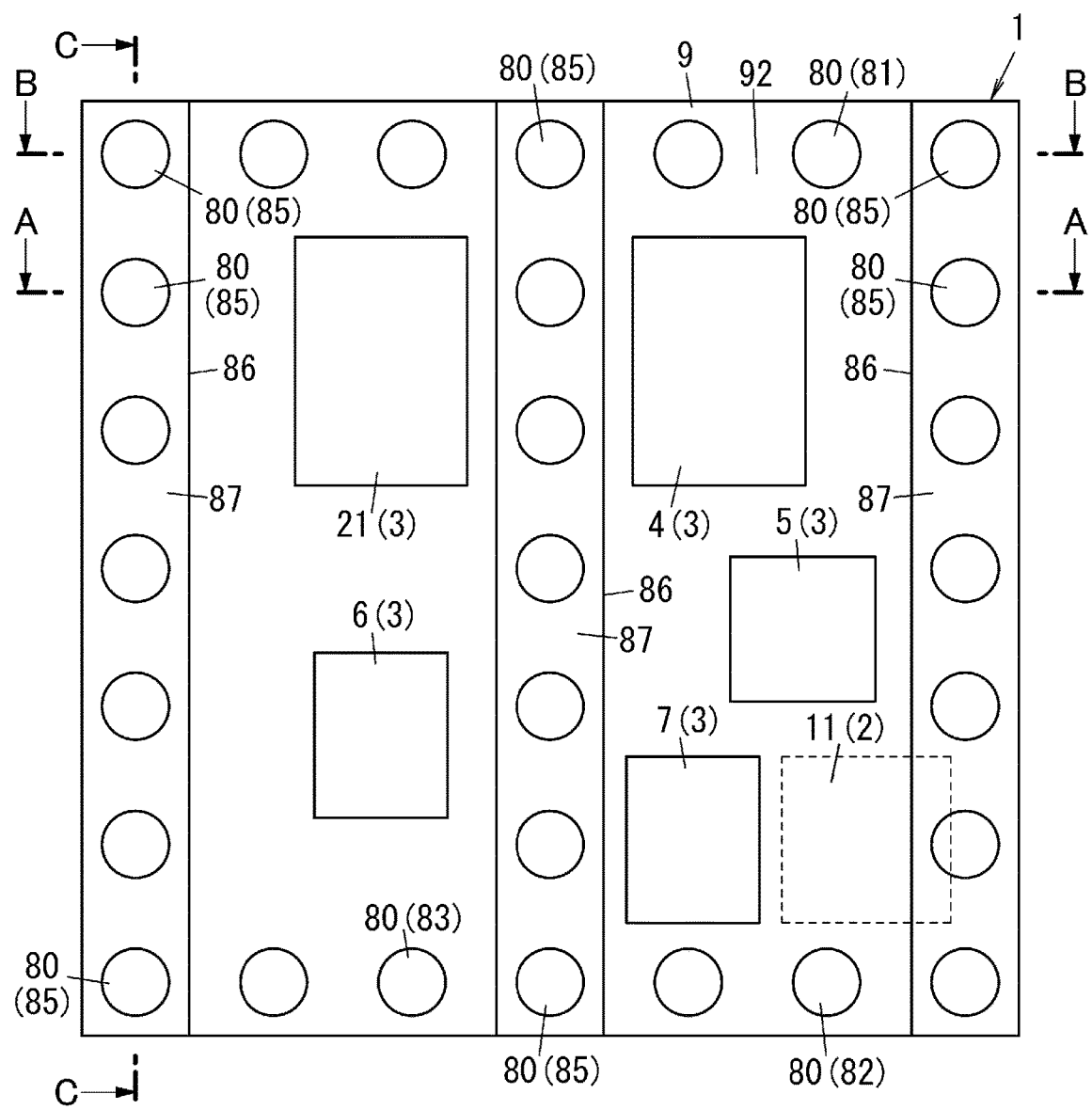
FIG. 1 is a bottom view of a radio frequency module according to an embodiment.
Figure 2:
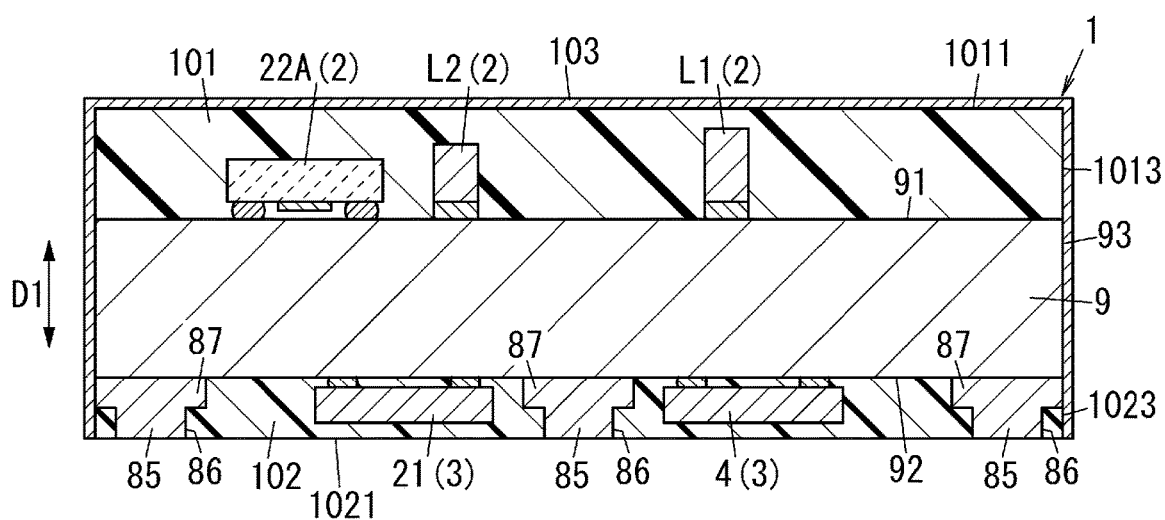
FIG. 2 illustrates the same radio frequency module as the above and is a cross-sectional view taken along line A-A in FIG. 1.
Figure 3:
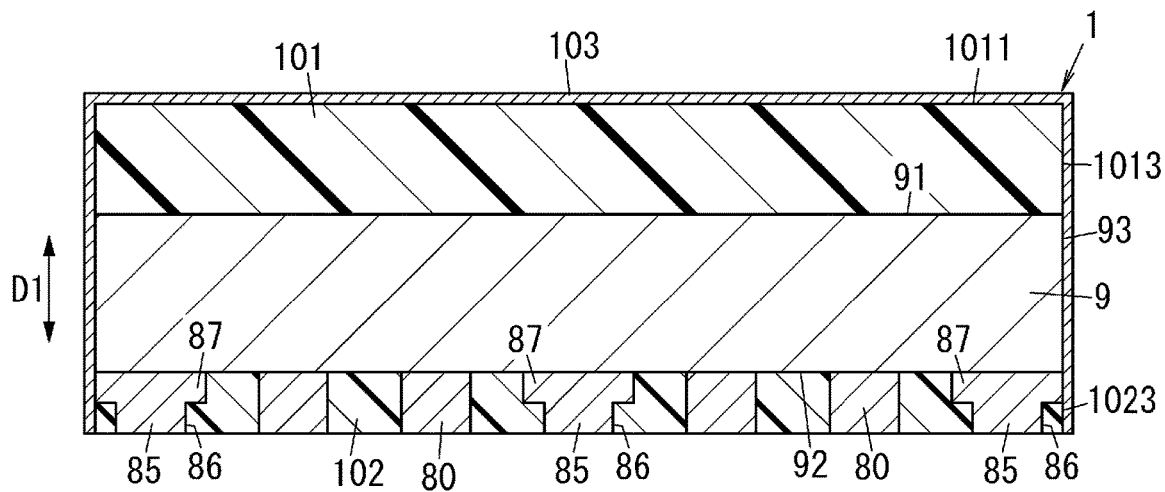
FIG. 3 illustrates the same radio frequency module as the above and is a cross-sectional view taken along line B-B in FIG. 1.
Figure 4:
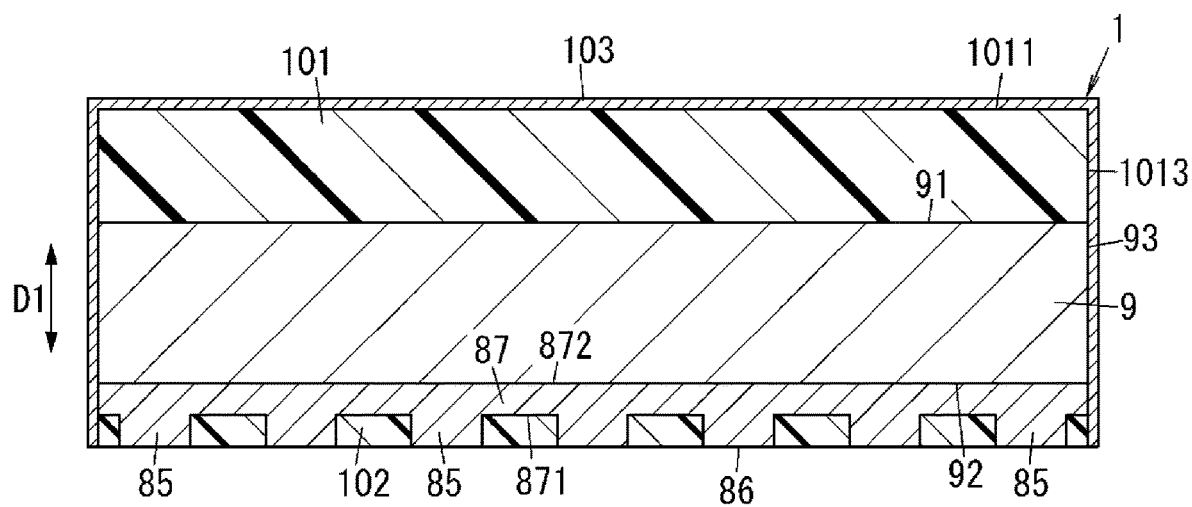
FIG. 4 illustrates the same radio frequency module as the above and is a cross-sectional view taken along line C-C in FIG. 1.
Figure 5:
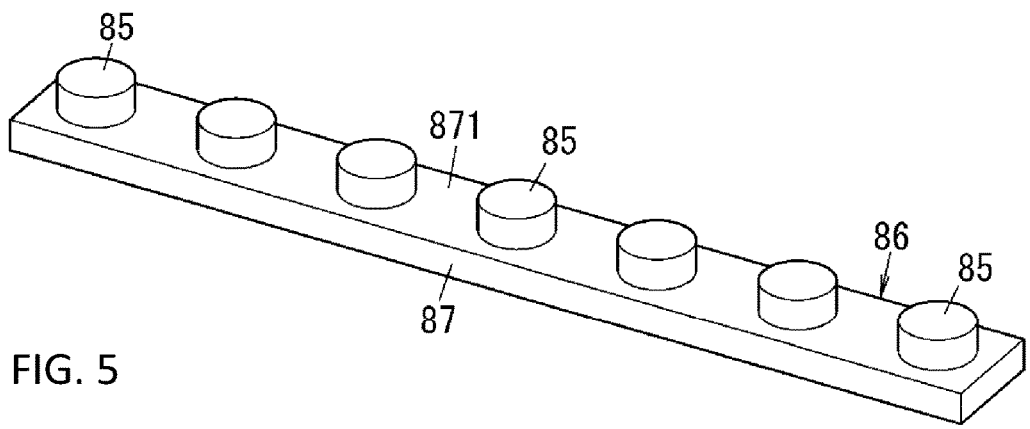
FIG. 5 is a perspective view of a block terminal of the same radio frequency module as the above.

FIGS. 1 to 5, 7, and 8 to be referred to in an embodiment and the like below are schematic diagrams. Thus, sizes and thickness ratios of components illustrated in the figures do not necessarily reflect actual dimension ratios.

Embodiment

A radio frequency module 1 and a communication apparatus 300 according to an embodiment will be described below with reference to FIGS. 1 to 6.

(1) Radio Frequency Module and Communication Apparatus (1.1) Circuit Configurations of Radio Frequency Module and Communication Apparatus Circuit configurations of the radio frequency module 1 and the communication apparatus 300 according to the embodiment will be described with reference to FIG. 6.

The radio frequency module 1 according to the embodiment is used in, for example, the communication apparatus 300. The communication apparatus 300 is, for example, a mobile phone (e.g., a smartphone). However, the communication apparatus 300 is not limited to this, and may be, for example, a wearable terminal (e.g., a smartwatch) or the like. The radio frequency module 1 is, for example, a module capable of supporting 4G (fourth-generation mobile communication) specification, 5G (fifth-generation mobile communication) specification, or the like. The 4G specification is, for example, 3GPP LTE (Long Term Evolution). The 5G specification is, for example, 5G NR (New Radio). The radio frequency module 1 is a module capable of supporting carrier aggregation and dual connectivity.

For example, the radio frequency module 1 is capable of amplifying a transmission signal inputted thereto from a signal processing circuit 301 and of outputting the amplified transmission signal to an antenna 310. The radio frequency module 1 is also capable of amplifying a reception signal inputted thereto from the antenna 310 and of outputting the amplified reception signal to the signal processing circuit 301. The signal processing circuit 301 is not a component of the radio frequency module 1 but is a component of the communication apparatus 300 including the radio frequency module 1. The radio frequency module 1 according to the embodiment is controlled by, for example, the signal processing circuit 301 included in the communication apparatus 300. The communication apparatus 300 includes the radio frequency module 1 and the signal processing circuit 301. The communication apparatus 300 further includes the antenna 310. The communication apparatus 300 further includes a circuit board on or in which the radio frequency module 1 is mounted. The circuit board is, for example, a printed circuit board. The circuit board has a ground electrode to be supplied with a ground potential.

The signal processing circuit 301 includes, for example, an RF signal processing circuit 302 and a baseband signal processing circuit 303. The RF signal processing circuit 302 is, for example, an RFIC (Radio Frequency Integrated Circuit), and performs signal processing on a radio frequency signal. For example, the RF signal processing circuit 302 performs signal processing such as up-conversion on a radio frequency signal (transmission signal) outputted from the baseband signal processing circuit 303, and outputs the radio frequency signal having undergone the signal processing. For example, the RF signal processing circuit 302 performs signal processing such as down-conversion on a radio frequency signal (reception signal) outputted from the radio frequency module 1 and outputs the radio frequency signal having undergone the signal processing to the baseband signal processing circuit 303. The baseband signal processing circuit 303 is, for example, a BBIC (Baseband Integrated Circuit), and performs predetermined signal processing on a transmission signal supplied from outside the signal processing circuit 301. The reception signal processed by the baseband signal processing circuit 303 is used, for example, as an image signal for displaying an image or as an audio signal for a call. The radio frequency module 1 transfers a radio frequency signal (reception signal or transmission signal) between the antenna 310 and the RF signal processing circuit 302 of the signal processing circuit 301. The baseband signal processing circuit 303 is not an essential component of the communication apparatus 300.

The radio frequency module 1 according to the embodiment includes a power amplifier 11 and a low noise amplifier 21. The radio frequency module 1 also includes two transmission filters 12A and 12B, two reception filters 22A and 22B, and a transmission-reception filter 24. The radio frequency module 1 also includes an output matching circuit 13 and an input matching circuit 23. The radio frequency module 1 also includes a first switch 4, a second switch 5, a third switch 6, and a fourth switch 7.

The radio frequency module 1 also includes a plurality of external connection terminals 80. The plurality of external connection terminals 80 include a plurality of signal terminals for a radio frequency signal (an antenna terminal 81, a signal input terminal 82, and a signal output terminal 83), and block terminals 86 (see FIG. 1) including a plurality of ground terminals 85 (see FIG. 1). The plurality of ground terminals 85 are terminals that are electrically connected to the ground electrode of the above-described circuit board of the communication apparatus 300 and are supplied with the ground potential.

The power amplifier 11 has an input terminal 111 and an output terminal 112. The power amplifier 11 amplifies a transmission signal of a predetermined frequency band inputted to the input terminal 111 thereof and outputs the amplified transmission signal from the output terminal 112 thereof. Herein, the predetermined frequency band includes, for example, a first communication band, a second communication band, and a third communication band. The first communication band corresponds to a transmission signal that passes through the transmission filter 12A and is, for example, Band 1 of the 3GPP LTE specification or n77 of the 5G NR specification. The second communication band corresponds to a transmission signal that passes through the transmission filter 12B and is, for example, Band 3 of the 3GPP LTE specification or n79 of the 5G NR specification. The third communication band corresponds to a transmission signal that passes through the transmission-reception filter 24 and is, for example, Band 7 of the 3GPP LTE specification or n257 of the 5G NR specification. The input terminal 111 of the power amplifier 11 is connected to the signal input terminal 82. The input terminal 111 of the power amplifier 11 is connected to the signal processing circuit 301 with the signal input terminal 82 interposed therebetween. The signal input terminal 82 is a terminal for inputting, to the radio frequency module 1, a radio frequency signal (transmission signal) supplied from an external circuit (e.g., the signal processing circuit 301). The output terminal 112 of the power amplifier 11 is connected to a common terminal 50 of the second switch 5 with the output matching circuit 13 interposed therebetween.

The low noise amplifier 21 has an input terminal 211 and an output terminal 212. The low noise amplifier 21 amplifies a reception signal of a predetermined frequency band inputted to the input terminal 211 thereof and outputs the amplified reception signal from the output terminal 212 thereof. The input terminal 211 of the low noise amplifier 21 is connected to a common terminal 60 of the third switch 6 with the input matching circuit 23 interposed therebetween. The output terminal 212 of the low noise amplifier 21 is connected to the signal output terminal 83. The output terminal 212 of the low noise amplifier 21 is connected to the signal processing circuit 301 with the signal output terminal 83 interposed therebetween, for example. The signal output terminal 83 is a terminal for outputting, to an external circuit (e.g., the signal processing circuit 301), a radio frequency signal (reception signal) supplied from the low noise amplifier 21.

The transmission filter 12A is, for example, a filter having a pass band that is a transmission band of the first communication band. The transmission filter 12B is, for example, a filter having a pass band that is a transmission band of the second communication band. The reception filter 22A is, for example, a filter having a pass band that is a reception band of the first communication band. The reception filter 22B is, for example, a filter having a pass band that is a reception band of the second communication band. The transmission-reception filter 24 is, for example, a filter having a pass band that is a transmission-reception band of the third communication band.

The first switch 4 includes a common terminal 40 and three selection terminals 41 to 43. The common terminal 40 is connected to the antenna terminal 81. The antenna 310 is connected to the antenna terminal 81. The selection terminal 41 is connected to a node of an output terminal of the transmission filter 12A and an input terminal of the reception filter 22A. A selection terminal 42 is connected to a node of an output terminal of the transmission filter 12B and an input terminal of the reception filter 22B. The selection terminal 43 is connected to the transmission-reception filter 24. The first switch 4 is, for example, a switch capable of connecting at least one or more of the three selection terminals 41 to 43 to the common terminal 40. The first switch 4 is, for example, a switch that enables one-to-one connection and one-to-multiple connection.

The first switch 4 is controlled by, for example, the signal processing circuit 301. The first switch 4 switches the connection states between the common terminal 40 and the three selection terminals 41 to 43 in accordance with a control signal supplied from the RF signal processing circuit 302 of the signal processing circuit 301. The first switch 4 is, for example, a switch IC (Integrated Circuit).

The second switch 5 includes the common terminal 50 and three selection terminals 51 to 53. The common terminal 50 is connected to the output terminal 112 of the power amplifier 11 with the output matching circuit 13 interposed therebetween. The selection terminal 51 is connected to an input terminal of the transmission filter 12A. The selection terminal 52 is connected to an input terminal of the transmission filter 12B. The selection terminal 53 is connected to a selection terminal 71 of the fourth switch 7. The second switch 5 is, for example, a switch capable of connecting at least one or more of the three selection terminals 51 to 53 to the common terminal 50. The second switch 5 is, for example, a switch that enables one-to-one connection and one-to-multiple connection.

The second switch 5 is controlled by, for example, the signal processing circuit 301. The second switch 5 switches the connection states between the common terminal 50 and the three selection terminals 51 to 53 in accordance with a control signal supplied from the RF signal processing circuit 302 of the signal processing circuit 301. The second switch 5 is, for example, a switch IC.

The third switch 6 includes the common terminal 60 and three selection terminals 61 to 63. The common terminal 60 is connected to the input terminal 211 of the low noise amplifier 21 with the input matching circuit 23 interposed therebetween. The selection terminal 61 is connected to an output terminal of the reception filter 22A. The selection terminal 62 is connected to an output terminal of the reception filter 22B. The selection terminal 63 is connected to a selection terminal 72 of the fourth switch 7. The third switch 6 is, for example, a switch capable of connecting at least one or more of the three selection terminals 61 to 63 to the common terminal 60. The third switch 6 is, for example, a switch that enables one-to-one connection and one-to-multiple connection.

The third switch 6 is controlled by, for example, the signal processing circuit 301. The third switch 6 switches the connection states between the common terminal 60 and the three selection terminals 61 to 63 in accordance with a control signal supplied from the RF signal processing circuit 302 of the signal processing circuit 301. The third switch 6 is, for example, a switch IC.

The fourth switch 7 includes a common terminal 70 and the two selection terminals 71 and 72 mentioned above. The common terminal 70 is connected to one input/output terminal of two input/output terminals of the transmission-reception filter 24. The selection terminal 71 is connected to the selection terminal 53 of the second switch 5. The selection terminal 72 is connected to the selection terminal 63 of the third switch 6. In the fourth switch 7, the two selection terminals 71 and 72 are exclusively connected to the common terminal 70. The fourth switch 7 can be constituted by, for example, an SPDT (Single Pole Double Throw) switch. The fourth switch 7 is, for example, a switch IC.

The output matching circuit 13 is disposed in a signal path between the output terminal 112 of the power amplifier 11 and the common terminal 50 of the second switch 5. The output matching circuit 13 is a circuit for achieving impedance matching between the power amplifier 11 and the transmission filter 12A, between the power amplifier 11 and the transmission filter 12B, and between the power amplifier 11 and the transmission-reception filter 24. The output matching circuit 13 includes, for example, a single inductor L1 (see FIG. 2). However, the configuration is not limited to this, and the output matching circuit 13 may include a plurality of inductors and a plurality of capacitors, for example.

The input matching circuit 23 is disposed in a signal path between the input terminal 211 of the low noise amplifier 21 and the common terminal 60 of the third switch 6. The input matching circuit 23 is a circuit for achieving impedance matching between the low noise amplifier 21 and the reception filter 22A, between the low noise amplifier 21 and the reception filter 22B, and between the low noise amplifier 21 and the transmission-reception filter 24. The input matching circuit 23 includes, for example, a single inductor L2 (see FIG. 2). However, the configuration is not limited to this, and the input matching circuit 23 may include a plurality of inductors and a plurality of capacitors, for example.

The radio frequency module 1 includes the fourth switch 7. Thus, the radio frequency module 1 is able to virtually implement, by using, for example, TDD (Time Division Duplex), simultaneous transmission and reception of a transmission signal (radio frequency signal for transmission) of a predetermined frequency band and a reception signal (radio frequency signal for reception) of a predetermined frequency band. The expression "to virtually implement" indicates that transmission of a transmission signal and reception of a reception signal are performed not simultaneously but within a short period that can be regarded as being simultaneous.

(1.2) Structure of Radio Frequency Module

A structure of the radio frequency module 1 will be described below with reference to FIGS. 1 to 5.

The radio frequency module 1 includes a mount board 9, a plurality of circuit elements, and the plurality of external connection terminals 80.

The mount board 9 has a first principal surface 91 and a second principal surface 92 facing each other. The mount board 9 is, for example, a printed circuit board, an LTCC (Low Temperature Co-fired Ceramics) board, or the like. Herein, the mount board 9 is, for example, a multilayer board including a plurality of dielectric layers and a plurality of conductive pattern layers. The plurality of dielectric layers and the plurality of conductive pattern layers are stacked in a thickness direction D1 of the mount board 9. The plurality of conductive pattern layers are formed to have predetermined patterns. Each of the plurality of conductive pattern layers includes one or a plurality of conductor portions in a single plane orthogonal to the thickness direction D1 of the mount board 9. A material of each conductive pattern layer is, for example, copper. The plurality of conductive pattern layers include ground layers. In the radio frequency module 1, the ground layers and the block terminals 86 including the plurality of ground terminals 85 are electrically connected to each other with via conductors or the like of the mount board 9 interposed therebetween.

The first principal surface 91 and the second principal surface 92 of the mount board 9 are separate from each other in the thickness direction D1 of the mount board 9 and intersect with the thickness direction D1 of the mount board 9. The first principal surface 91 of the mount board 9 is, for example, orthogonal to the thickness direction D1 of the mount board 9. However, the first principal surface 91 may include, for example, a side surface or the like of the conductor portion, as a surface that is not orthogonal to the thickness direction D1. The second principal surface 92 of the mount board 9 is, for example, orthogonal to the thickness direction D1 of the mount board 9. However, the second principal surface 92 may include, for example, a side surface or the like of the conductor portion, as a surface that is not orthogonal to the thickness direction D1. The first principal surface 91 and the second principal surface 92 of the mount board 9 may have fine depressions and projections, or a depression portion or a projection portion.

The radio frequency module 1 includes, as the plurality of circuit elements, the power amplifier 11, the low noise amplifier 21, the two transmission filters 12A and 12B, the two reception filters 22A and 22B, the transmission-reception filter 24, the output matching circuit 13, and the input matching circuit 23 that are described above. The plurality of circuit elements of the radio frequency module 1 are mounted on the mount board 9. The plurality of circuit elements are not limited to electronic components mounted on the mount board 9 but also include circuit elements disposed in the mount board 9. The plurality of circuit elements include a first circuit element 2 mounted on the first principal surface 91 of the mount board 9, and a second circuit element 3 mounted on the second principal surface 92. The radio frequency module 1 according to the embodiment includes a plurality of first circuit elements 2. The radio frequency module 1 according to the embodiment includes a plurality of second circuit elements 3.

The plurality of first circuit elements 2 include the power amplifier 11, the two transmission filters 12A and 12B, the two reception filters 22A and 22B, the transmission-reception filter 24, and the two inductors L1 and L2. In FIG. 1, the power amplifier 11 alone is illustrated in relation to the plurality of first circuit elements 2.

The plurality of second circuit elements 3 include the first switch 4, the second switch 5, the third switch 6, the fourth switch 7, and the low noise amplifier 21. In the radio frequency module 1, the first switch 4 serves as an antenna switch electrically connected to the antenna terminal 81. The first switch 4 is provided for signal paths for both of a transmission signal and a reception signal. In the radio frequency module 1, the first switch 4 is provided for a transmission signal path in which the power amplifier 11, the output matching circuit 13, the second switch 5, and the transmission filter 12A are disposed. The first switch 4 is provided also for a transmission signal path in which the power amplifier 11, the output matching circuit 13, the third switch 6, and the transmission filter 12B are disposed. The first switch 4 is provided also for a transmission signal path in which the power amplifier 11, the output matching circuit 13, the fourth switch 7, and the transmission-reception filter 24 are disposed. The first switch 4 is provided also for a reception signal path in which the reception filter 22A, the third switch 6, the input matching circuit 23, and the low noise amplifier 21 are disposed. The first switch 4 is provided also for a reception signal path in which the reception filter 22B, the third switch 6, the input matching circuit 23, and the low noise amplifier 21 are disposed. The first switch 4 is provided also for a reception signal path in which the transmission-reception filter 24, the fourth switch 7, the input matching circuit 23, and the low noise amplifier 21 are disposed.

In the radio frequency module 1, the power amplifier 11 is an IC chip including a substrate having a first principal surface (front surface) and a second principal surface (back surface) facing each other, and an IC unit that includes at least one transistor formed on the first principal surface side of this substrate. The substrate is, for example, a gallium arsenide substrate. The IC unit has a function of amplifying a transmission signal inputted to the input terminal 111 of the power amplifier 11. The transistor is, for example, an HBT (Heterojunction Bipolar Transistor). The power amplifier 11 may include, for example, a DC blocking capacitor. The IC chip constituting the power amplifier 11 is flip-chip mounted on the first principal surface 91 of the mount board 9 such that the first principal surface among the first principal surface and the second principal surface of the substrate is on the first principal surface 91 side of the mount board 9. The outer peripheral shape of the power amplifier 11 is a quadrangular shape in plan view in the thickness direction D1 of the mount board 9.

The low noise amplifier 21 is, for example, a single IC chip including a substrate having a first principal surface (front surface) and a second principal surface (back surface) facing each other, and an amplification functional unit formed on the first principal surface side of this substrate. The substrate is, for example, a silicon substrate. The amplification functional unit is a functional unit having a function of amplifying a reception signal inputted to the input terminal 211 of the low noise amplifier 21. The functional unit includes a transistor. The low noise amplifier 21 is flip-chip mounted on the second principal surface 92 of the mount board 9 such that the first principal surface among the first principal surface and the second principal surface of the substrate is on the second principal surface 92 side of the mount board 9. The outer peripheral shape of the low noise amplifier 21 is a quadrangular shape in plan view in the thickness direction D1 of the mount board 9.

Each of the two transmission filters 12A and 12B, the two reception filters 22A and 22B, and the transmission-reception filter 24 is, for example, a single-chip filter. That is, the outer peripheral shape of each of the transmission filters 12A and 12B, the two reception filters 22A and 22B, and the transmission-reception filter 24 is a quadrangular shape in plan view in the thickness direction D1 of the mount board 9. Each of the filters is, for example, a ladder filter and includes a plurality of (for example, four) series-arm resonators and a plurality of (for example, three) parallel-arm resonators. Each of the filters is, for example, an acoustic wave filter, and each of the plurality of series-arm resonators and the plurality of parallel-arm resonators thereof is an acoustic wave resonator. The acoustic wave filter is, for example, a SAW (Surface Acoustic Wave) filter that uses a surface acoustic wave. In this case, the filter includes, for example, a substrate having a first principal surface (front surface) and a second principal surface (back surface) facing each other, a low acoustic velocity film disposed on the first principal surface of this substrate, a piezoelectric layer disposed on the low acoustic velocity film, and a plurality of first IDT (Interdigital Transducer) electrodes and a plurality of second IDT electrodes that are disposed on this piezoelectric layer. The plurality of first IDT electrodes have one-to-one correspondence with the plurality of series-arm resonators, and the plurality of second IDT electrodes have one-to-one correspondence with the plurality of parallel-arm resonators. The "plurality of first IDT electrodes" and "plurality of second IDT electrodes" are hereinafter collectively referred to as a plurality of IDT electrodes. Herein, the low acoustic velocity film is disposed directly or indirectly on the substrate. The piezoelectric layer is disposed directly or indirectly on the low acoustic velocity film. In the low acoustic velocity film, an acoustic velocity of a bulk wave propagating through the low acoustic velocity film is lower than an acoustic velocity of a bulk wave propagating through the piezoelectric layer. An acoustic velocity of a bulk wave propagating through the substrate is higher than an acoustic velocity of an acoustic wave propagating through the piezoelectric layer. A material of the piezoelectric layer is, for example, lithium tantalate. A material of the low acoustic velocity film is, for example, silicon oxide. The substrate is, for example, a silicon substrate. The piezoelectric layer has, for example, a thickness of $3.5\lambda$ or less, where $\lambda$ denotes the wavelength of an acoustic wave that is determined by the period of electrode fingers of the IDT electrodes. The low acoustic velocity film has, for example, a thickness of $2.0\lambda$ or less.

The piezoelectric layer may be formed of any of, for example, lithium tantalate, lithium niobate, zinc oxide, aluminum nitride, or PZT. The low acoustic velocity film may contain at least one material selected from the group consisting of silicon oxide, glass, silicon oxynitride, tantalum pentoxide, a compound of silicon oxide and fluorine, a compound of silicon oxide and carbon, and a compound of silicon oxide and boron. The substrate may contain at least one material selected from the group consisting of silicon, aluminum nitride, aluminum oxide, silicon carbide, silicon nitride, sapphire, lithium tantalate, lithium niobate, quartz crystal, alumina, zirconia, cordierite, mullite, steatite, forsterite, magnesia, and diamond.

The filter may further include, for example, a spacer layer and a cover member. The spacer layer and the cover member are disposed on the first principal surface side of the substrate. The spacer layer surrounds the plurality of IDT electrodes in plan view in the thickness direction of the substrate. The spacer layer has a frame-like shape (rectangular frame-like shape) in plan view in the thickness direction of the substrate. The spacer layer has an electrical insulation property. A material of the spacer layer is, for example, a synthetic resin such as an epoxy resin or polyimide. The cover member has a planar shape. The cover member has a rectangular shape in plan view in the thickness direction of the substrate. However, the shape of the cover member is not limited to this, and the cover member may have, for example, a square shape. In the filter, the outer size of the cover member, and the outer size of the spacer layer, are substantially equal in plan view in the thickness direction of the substrate. The cover member is disposed on the spacer layer to face the substrate in the thickness direction of the substrate. The cover member overlaps the plurality of IDT electrodes in the thickness direction of the substrate and are separate from the plurality of IDT electrodes in thickness direction of the substrate. The cover member has an electrical insulation property. A material of the cover member is, for example, a synthetic resin such as an epoxy resin or polyimide. The filter has a space surrounded by the substrate, the spacer layer, and the cover member. In the filter, the space is filled with a gas. The gas is, for example, air, an inert gas (e.g., nitrogen gas), or the like. A plurality of terminals of the filter are exposed from the cover member. The plurality of terminals are, for example, bumps. The bumps are, for example, solder bumps. The bumps are not limited to solder bumps and may be, for example, gold bumps.

Each of the filters is mounted on the first principal surface 91 of the mount board 9. The filter is disposed such that the first principal surface among the first principal surface and the second principal surface of the substrate is on the mount board 9 side. The outer peripheral shape of the filter is a quadrangular shape in plan view in the thickness direction D1 of the mount board 9. The manner in which the filter is mounted is not limited to the case where the filter is mounted on the first principal surface 91 of the mount board 9, and the filter may be mounted on, for example, the second principal surface 92.

The filter may include, for example, a close contact layer interposed between the low acoustic velocity film and the piezoelectric layer. The close contact layer is composed of, for example, a resin (epoxy resin or polyimide resin). The filter may also include a dielectric film interposed between the low acoustic velocity film and the piezoelectric layer, on the piezoelectric layer, or under the low acoustic velocity film.

The filter may also include, for example, a high acoustic velocity film interposed between the substrate and the low acoustic velocity film. In this case, the high acoustic velocity film is disposed directly or indirectly on the substrate. The low acoustic velocity film is disposed directly or indirectly on the high acoustic velocity film. The piezoelectric layer is disposed directly or indirectly on the low acoustic velocity film. In the high acoustic velocity film, an acoustic velocity of a bulk wave propagating through the high acoustic velocity film is higher than an acoustic velocity of an acoustic wave propagating through the piezoelectric layer. In the low acoustic velocity film, an acoustic velocity of a bulk wave propagating through the low acoustic velocity film is lower than an acoustic velocity of a bulk wave propagating through the piezoelectric layer.

The high acoustic velocity film is composed of a piezoelectric material such as diamond-like carbon, aluminum nitride, aluminum oxide, silicon carbide, silicon nitride, silicon, sapphire, lithium tantalate, lithium niobate, or quartz crystal; each of various ceramics such as alumina, zirconia, cordierite, mullite, steatite, and forsterite; magnesia; diamond; a material containing any of the above materials as a principal component; or a material containing a mixture of any of the above materials as a principal component.

The high acoustic velocity film has a function of trapping an acoustic wave in the piezoelectric layer and the low acoustic velocity film. Thus, in terms of the thickness of the high acoustic velocity film, a thicker high acoustic velocity film is more desirable. A piezoelectric substrate including the high acoustic velocity film, the low acoustic velocity film, and the piezoelectric layer may include the close contact layer, the dielectric film, or the like as a film other than the high acoustic velocity film, the low acoustic velocity film, and the piezoelectric layer.

Each of the plurality of series-arm resonators and the plurality of parallel-arm resonators is not limited to the acoustic wave resonator described above and may be, for example, a SAW (Surface Acoustic Wave) resonator or a BAW (Bulk Acoustic Wave) resonator. Herein, the SAW resonator includes, for example, a piezoelectric substrate, and IDT electrodes disposed on the piezoelectric substrate. When the SAW resonator serves as each of the plurality of series-arm resonators and the plurality of parallel-arm resonators, the filter includes, on the single piezoelectric substrate, a plurality of IDT electrodes having one-to-one correspondence with the plurality of series-arm resonators and a plurality of IDT electrodes having one-to-one correspondence with the plurality of parallel-arm resonators. The piezoelectric substrate is, for example, a lithium tantalate substrate, a lithium niobate substrate, or the like.

Each of the first switch 4, the second switch 5, the third switch 6, and the fourth switch 7 is a switch IC. More specifically, each of the first switch 4, the second switch 5, the third switch 6, and the fourth switch 7 is, for example, a single IC chip including a substrate having a first principal surface (front surface) and a second principal surface (back surface) facing each other, and a switch functional unit including a FET (Field Effect Transistor) formed on the first principal surface side of this substrate. The substrate is, for example, a silicon substrate. The switch functional unit is a functional unit having a function of switching the connection state. Each of the first switch 4, the second switch 5, the third switch 6, and the fourth switch 7 is flip-chip mounted on the second principal surface 92 of the mount board 9 such that the first principal surface among the first principal surface and the second principal surface of the substrate is on the second principal surface 92 side of the mount board 9. The outer peripheral shape of each of the first switch 4, the second switch 5, the third switch 6, and the fourth switch 7 is a quadrangular shape in plan view in the thickness direction D1 of the mount board 9.

The inductor L1 of the output matching circuit 13 is, for example, a chip inductor. The inductor L1 of the output matching circuit 13 is mounted, but not limited to, on the first principal surface 91 of the mount board 9, for example. The outer peripheral shape of the inductor L1 is a quadrangular shape in plan view in the thickness direction D1 of the mount board 9.

The output matching circuit 13 may be, for example, an IPD (Integrated Passive Device). The IPD includes a substrate having a first principal surface (front surface) and a second principal surface (back surface) facing each other, and a plurality of inductors and a plurality of capacitors formed on the first principal surface side of this substrate. The substrate is, for example, a silicon substrate. When the output matching circuit 13 is the IPD, the output matching circuit 13 is, for example, flip-chip mounted on the first principal surface 91 of the mount board 9 such that the first principal surface among the first principal surface and the second principal surface of the substrate is on the first principal surface 91 side of the mount board 9.

The inductor L2 of the input matching circuit 23 is, for example, a chip inductor. The inductor L2 of the input matching circuit 23 is disposed, but not limited to, on the first principal surface 91 of the mount board 9, for example. The outer peripheral shape of the inductor L2 is a quadrangular shape in plan view in the thickness direction D1 of the mount board 9.

The input matching circuit 23 may be, for example, an IPD. The IPD includes a substrate having a first principal surface (front surface) and a second principal surface (back surface) facing each other, and a plurality of inductors and a plurality of capacitors formed on the first principal surface side of this substrate. The substrate is, for example, a silicon substrate. When the input matching circuit 23 is the IPD, the input matching circuit 23 is, for example, flip-chip mounted on the first principal surface 91 of the mount board 9 such that the first principal surface among the first principal surface and the second principal surface of the substrate is on the first principal surface 91 side of the mount board 9.

The plurality of external connection terminals 80 are disposed on the second principal surface 92 of the mount board 9. A material of the plurality of external connection terminals 80 is, for example, a metal (e.g., copper, a copper alloy, or the like).

Each of the antenna terminal 81, the signal input terminal 82, and the signal output terminal 83 that are signal terminals for a radio frequency signal among the plurality of external connection terminals 80 is a pillar-shaped electrode. In this case, the pillar-shaped electrode is, for example, an electrode having a columnar shape. The plurality of external connection terminals 80 include a control terminal other than the signal terminals for a radio frequency signal and the ground terminals 85. A control signal outputted from the signal processing circuit 301 is inputted to the control terminal to control the power amplifier 11, the low noise amplifier 21, the first switch 4, the second switch 5, the third switch 6, and the fourth switch 7.

As described above, the plurality of external connection terminals 80 include, in addition to the signal terminals for a radio frequency signal, the plurality of ground terminals 85 of the block terminals 86. The radio frequency module 1 according to the embodiment includes three block terminals 86. A material of each of the three block terminals 86 is, for example, a metal (e.g., copper, a copper alloy, or the like). Each of the plurality of external connection terminals 80 may have, for example, a plating layer at a tip portion thereof.

The three block terminals 86 are disposed on the second principal surface 92 of the mount board 9. The three block terminals 86 have one-to-one correspondence with three ground layers having principal surfaces that constitute part of the second principal surface 92 of the mount board 9 and are joined to the respective ground layers by, for example, solder. Thus, the block terminals 86 are electrically connected to the respective ground layers. Two block terminals 86 among the three block terminals 86 are respectively disposed along two facing sides among four sides of the second principal surface 92 of the mount board 9. One block terminal 86 is located separately from the two block terminals 86 between the two block terminals 86. Thus, the plurality of ground terminals 85 of each of the two block terminals 86 are disposed along the outer periphery of the second principal surface 92 of the mount board 9. The three block terminals 86 are arranged in one direction. The one block terminal 86 among the three block terminals 86 is located between the first switch 4 (antenna switch) and the low noise amplifier 21 in plan view in the thickness direction D1 of the mount board 9. In the radio frequency module 1, the two ground terminals 85 are arranged in a direction that intersects (for example, orthogonally) with a direction in which the first switch 4 and the low noise amplifier 21 are arranged, between the first switch 4 and the low noise amplifier 21 in plan view in the thickness direction D1 of the mount board 9.

Each of the three block terminals 86 includes a base portion 87 and the plurality of ground terminals 85. The base portion 87 and the plurality of ground terminals 85 are integrated. The base portion 87 is disposed on the second principal surface 92 of the mount board 9. The plurality of ground terminals 85 protrude from the base portion 87 toward an opposite side from the second principal surface 92 of the mount board 9. The base portion 87 has, for example, a planar shape having a first principal surface 871 and a second principal surface 872 facing each other. The plurality of ground terminals 85 protrude from the first principal surface 871 of the base portion 87. Each of the three block terminals 86 is disposed on the second principal surface 92 of the mount board 9 such that the second principal surface 872 of the base portion 87 is located on the second principal surface 92 side of the mount board 9.

In the radio frequency module 1 according to the embodiment, the base portion 87 of each of the block terminals 86 has a long planar shape. Each of the plurality of ground terminals 85 has, for example, a columnar shape. In plan view in the thickness direction D1 of the mount board 9, the base portion 87 has a thin long rectangular shape (strip-like shape), and each of the plurality of ground terminals 85 has a circular shape.

The plurality of ground terminals 85 are arranged in the lengthwise direction of the base portion 87 at an even interval in plan view in the thickness direction D1 of the mount board 9. However, the arrangement is not limited to this, and it is sufficient that the plurality of ground terminals 85 are separate from each other. Each of the plurality of ground terminals 85 has a diameter that is shorter than a widthwise-direction length of the base portion 87 in plan view in the thickness direction D1 of the mount board 9. However, the diameter is not limited to this and may be equal to the widthwise-direction length of the base portion 87.

The sizes of the three block terminals 86 are equal to each other in plan view in the thickness direction D1 of the mount board 9. However, the sizes may be different from each other. The three block terminals 86 have the same number of ground terminals 85. However, the three block terminals 86 may have different numbers of ground terminals 85.

The three block terminals 86 is electrically connected to the respective ground layers of the mount board 9. The ground layers are the circuit grounds of the radio frequency module 1. The plurality of circuit elements (the plurality of first circuit elements 2 and the plurality of second circuit elements 3) of the radio frequency module 1 include a circuit element electrically connected to the ground layer.

In the radio frequency module 1 according to the embodiment, part of one block terminal 86 among the three block terminals 86 overlaps part of the power amplifier 11 in plan view in the thickness direction D1 of the mount board 9. The power amplifier 11 has a ground electrode. The ground electrode of the power amplifier 11 is electrically connected to the block terminal 86.

The radio frequency module 1 further includes a resin layer 101 (hereinafter, also referred to as a first resin layer 101) on the first principal surface 91 side of the mount board 9. The first resin layer 101 covers the plurality of first circuit elements 2 and so on mounted on the first principal surface 91 of the mount board 9. The first resin layer 101 may contain a filler in addition to the resin.

The radio frequency module 1 further includes a resin layer 102 (hereinafter, also referred to as a second resin layer 102) on the second principal surface 92 side of the mount board 9. The second resin layer 102 covers the plurality of second circuit elements 3 mounted on the second principal surface 92 of the mount board 9. The second resin layer 102 may contain a filler in addition to the resin. A material of the second resin layer 102 and a material of the first resin layer 101 may be the same or may be different from each other. In the radio frequency module 1, the first principal surface 871 of the base portion 87 of each of the block terminals 86 is covered with part of the second resin layer 102. In the radio frequency module 1 according to the embodiment, the second principal surface of the substrate of each of at least two second circuit elements 3, a principal surface 1021 of the second resin layer 102 located on an opposite side from the mount board 9, and a tip surface of each of the plurality of external connection terminals 80 are substantially flush with each other. In the radio frequency module 1, the second principal surface of the substrate of at least one second circuit element 3 among the plurality of second circuit elements 3 may be exposed. In this case, for example, the second principal surface of the substrate of the at least one second circuit element 3 is substantially flush with the principal surface 1021 of the second resin layer 102.

The radio frequency module 1 further includes a shield layer 103. A material of the shield layer 103 is, for example, a metal or an alloy. The shield layer 103 covers a principal surface 1011 and an outer peripheral surface 1013 of the first resin layer 101, an outer peripheral surface 93 of the mount board 9, and an outer peripheral surface 1023 of the second resin layer 102. The shield layer 103 is in contact with the ground layers of the mount board 9. This allows the shield layer 103 to have a potential equal to the potential of the ground layers.

(2) Method for Fabricating Radio Frequency Module

In a method for manufacturing the radio frequency module, for example, a first process of mounting the plurality of circuit elements on the mount board 9 is performed. In the first process, a step of mounting the plurality of first circuit elements 2 on the first principal surface 91 of the mount board 9 is performed. In the first process, a step of mounting the plurality of second circuit elements 3 on the second principal surface 92 of the mount board 9 is performed. In the first process, either step of the step of mounting the plurality of first circuit elements 2 on the first principal surface 91 of the mount board 9 and the step of mounting the plurality of second circuit elements 3 on the second principal surface 92 of the mount board 9 may be performed first. In the first process, a step of disposing, on the second principal surface 92 of the mount board 9, the block terminals 86 and the external connection terminals 80 other than the ground terminals 85 among the plurality of external connection terminals 80 is performed. In the first process, for example, the plurality of first circuit elements 2, the plurality of second circuit elements 3, the plurality of block terminals 86, and the external connection terminals 80 other than the ground terminals 85 may be soldered to the mount board 9 through single reflow soldering. In a method of forming of the block terminal 86, for example, a metal plate having a first principal surface and a second principal surface and serving as a base of the block terminal 86 is prepared. A second region of the first principal surface of the metal plate, other than first regions (circular regions) corresponding to the tip surfaces of the plurality of ground terminals 85, is pressed with a die. In this manner, the block terminal 86 is formed.

After the first process described above, a second process is performed. In the second process, a step of forming the first resin layer 101 that coverts the plurality of first circuit elements 2 on the first principal surface 91 side of the mount board 9, and a step of forming a resin layer serving as a base of the second resin layer 102 that covers the plurality of second circuit elements 3, the plurality of block terminals 86, and the external connection terminals 80 other than the ground terminals 85 on the second principal surface 92 side of the mount board 9 are performed.

After the second process described above, a third process is performed. In the third process, the resin layer or the like formed in the second process are ground from the surface on the opposite side from the mount board 9. Herein, in the third process, the second resin layer 102 is formed by grinding the resin layer. In the method for fabricating the radio frequency module, the tip surfaces of the plurality of external connection terminals 80 are exposed in the third process.

After the third process described above, a fourth process is performed. In the fourth process, the shield layer 103 is formed. The first process, the second process, and the third process may be performed on a multi-piece board that includes the plurality of mount boards 9 and from which the multiple mount boards 9 can be obtained. In this case, for example, after the third process, the multi-piece board may be divided into the individual mount boards 9. Then, the fourth process may be performed.

(3) Recapitulation (3.1) Radio Frequency Module

The radio frequency module 1 according to the embodiment includes the mount board 9, the first circuit elements 2, the second circuit elements 3, the signal terminals (the antenna terminal 81, the signal input terminal 82, and the signal output terminal 83) for a radio frequency signal, and the block terminals 86. The first circuit elements 2 are mounted on the first principal surface 91 of the mount board 9. The second circuit elements 3 are mounted on the second principal surface 92 of the mount board 9. The signal terminals (the antenna terminal 81, the signal input terminal 82, and the signal output terminal 83) are disposed on the second principal surface 92 of the mount board 9. The block terminals 86 are disposed on the second principal surface 92 of the mount board 9. The block terminals 86 each include the plurality of ground terminals 85.

The radio frequency module 1 according to the embodiment is capable of suppressing a change in potential at the ground terminals 85. In the radio frequency module 1, the first circuit elements 2 are mounted on the first principal surface 91 of the mount board 9, and the second circuit elements 3 are mounted on the second principal surface 92 of the mount board 9. This allows a reduction in size of the radio frequency module 1 when viewed in the thickness direction D1 of the mount board 9. On the other hand, in the radio frequency module 1 according to the embodiment, the second circuit elements 3 are mounted on the second principal surface 92 of the mount board 9. Thus, the number of ground terminals 85 may decrease, compared with the case where the second circuit elements 3 are not mounted on the second principal surface 92. However, the radio frequency module 1 according to the embodiment includes the block terminals 86 each including the plurality of ground terminals 85. This allows a cross-sectional area of the cross-sections, orthogonal to the thickness direction D1 of the mount board 9, of the conductor portions that are supplied with the ground potential to be increased, compared with the case where the plurality of ground terminals are disposed, as individual pillar-shaped electrodes, on the second principal surface 92 of the mount board 9. Herein, the conductor portions supplied with the ground potential are portions electrically connected to the ground layers of the mount board 9 and each include the plurality of ground terminals 85 and the base portion 87. The aforementioned cross-sectional area is the cross-sectional area of the base portions 87. Thus, in the radio frequency module 1 according to the embodiment, it is possible to reduce the resistance of the conductor portions supplied with the ground potential and to enhance the ground. As a result, the radio frequency module 1 according to the embodiment is capable of suppressing a change in potential at the ground terminals 85. The radio frequency module 1 according to the embodiment includes the block terminals 86 each including the plurality of ground terminals 85. This makes handling easier when the plurality of ground terminals 85 are disposed on the mount board 9 than in the case where the plurality of ground terminals 85 are discrete components (pillar-shaped electrodes).

The radio frequency module 1 according to the embodiment includes the plurality of block terminals 86. Thus, the radio frequency module 1 according to the embodiment is able to further increase the cross-sectional area of the conductor portions that are disposed on the second principal surface 92 of the mount board 9 and that are supplied with the ground potential.

In the radio frequency module 1 according to the embodiment, the plurality of second circuit elements 3 include the first switch 4 (antenna switch) and the low noise amplifier 21. In the radio frequency module 1 according to the embodiment, one block terminal 86 among the three block terminals 86 is located between the first switch 4 (antenna switch) and the low noise amplifier 21 in plan view in the thickness direction D1 of the mount board 9. Thus, the radio frequency module 1 according to the embodiment is capable of improving the isolation between the first switch 4 and the low noise amplifier 21.

In the radio frequency module 1 according to the embodiment, the power amplifier 11 and the low noise amplifier 21 do not overlap in plan view in the thickness direction D1 of the mount board 9. Thus, the radio frequency module 1 is capable of improving the isolation between the power amplifier 11 and the low noise amplifier 21. The radio frequency module 1 according to the embodiment has the ground layer in the mount board 9 between the power amplifier 11 and the low noise amplifier 21. Thus, the radio frequency module 1 is capable of further improving the isolation between the power amplifier 11 and the low noise amplifier 21. The ground layer is electrically connected to the three block terminals 86, for example.

(3.2) Communication Apparatus

The communication apparatus 300 according to the embodiment includes the signal processing circuit 301 and the radio frequency module 1. The signal processing circuit 301 performs signal processing on a radio frequency signal. More specifically, the signal processing circuit 301 performs signal processing on a reception signal (radio frequency signal) supplied from the antenna 310 and on a transmission signal (radio frequency signal) supplied to the antenna 310. The radio frequency module 1 transfers a reception signal and a transmission signal between the antenna 310 and the signal processing circuit 301.

Since the communication apparatus 300 according to the embodiment includes the radio frequency module 1, the communication apparatus 300 is capable of suppressing a change in potential at the ground terminals 85.

The embodiment described above is merely one of various embodiments of the present disclosure. The embodiment described above may be modified variously in accordance with the design or the like as long as the object of the present disclosure is achieved.

(4) Modifications (4.1) Modification of Radio Frequency Module

Figure 7:
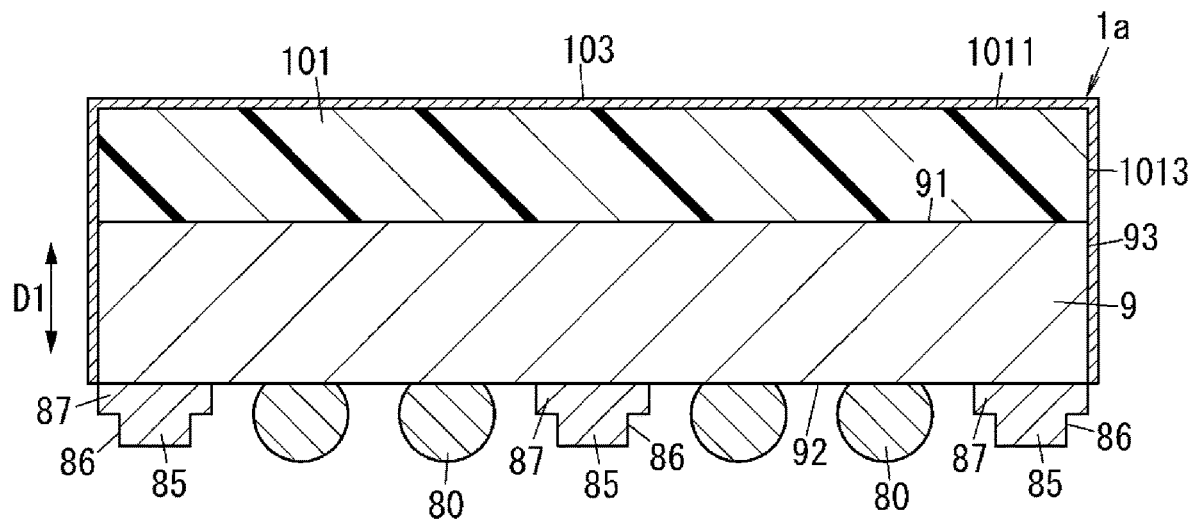
FIG. 7 is a cross-sectional view of a radio frequency module according to a modification of the embodiment.

A radio frequency module 1a according to a modification of the embodiment will be described with reference to FIG. 7. Components of the radio frequency module 1a according to the modification that are substantially the same as those of the radio frequency module 1 according to the embodiment are denoted by the same reference signs, and the description of these components are omitted.

In the radio frequency module 1a according to the modification, each of the external connection terminals 80 other than the external connection terminals 80 (the ground terminals 85) included in the block terminals 86 among the plurality of external connection terminals 80 is a bump. Herein, the bump has, for example, a spherical shape. That is, the bump is a ball bump. A material of the ball bump is, for example, gold, copper, solder, or the like.

The radio frequency module 1*a* according to the modification differs from the radio frequency module 1 according to the embodiment also in that the radio frequency module 1*a* does not include the second resin layer 102 of the radio frequency module 1 according to the embodiment.

The radio frequency module 1*a* according to the modification includes the block terminals 86 disposed on the second principal surface 92 of the mount board 9 as with the radio frequency module according to the first embodiment. Thus, the radio frequency module 1*a* is capable of suppressing a change in potential at the ground terminals 85.

(4.2) Other Modifications

Figure 8:
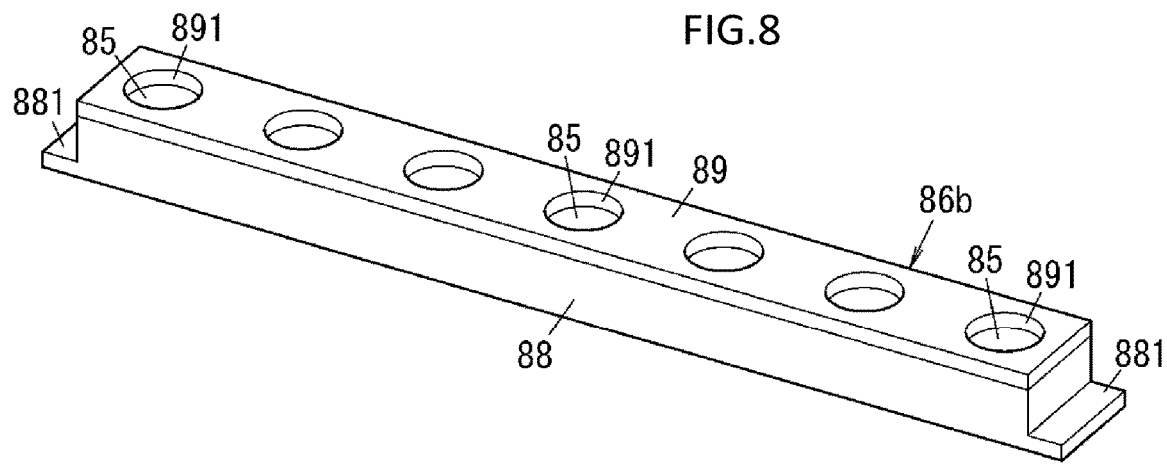
FIG. 8 is a perspective view of a block terminal of a radio frequency module according to another modification.
Figure 9:
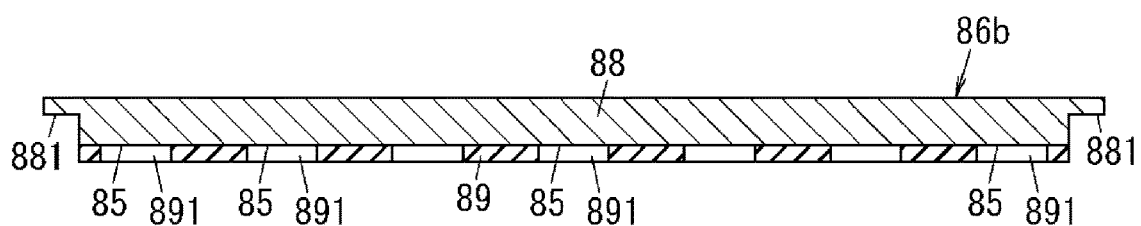
FIG. 9 is a cross-sectional view of the block terminal of the same radio frequency module as the above.

For example, the radio frequency modules 1 and 1*a* may include block terminals 86*b* illustrated in FIGS. 8 and 9 instead of the block terminals 86.

The block terminal 86*b* includes a conductor block 88 and a resist layer 89. The conductor block 88 is disposed on the second principal surface 92 of the mount board 9. Herein, the conductor block 88 has conductivity, whereas the resist layer 89 has an electrical insulation property. The conductor block 88 has a thin long planar shape. The block terminal 86*b* further has a pair of projection portions 881 that project from respective end surfaces of the conductor block 88 in the lengthwise direction. A material of the conductor block 88 is, for example, copper, a copper alloy, or the like. The resist layer 89 is, for example, a solder resist. Thus, a material of the resist layer 89 is a material having a lower wettability than the conductor block 88. The conductor block 88 is joined to the corresponding ground layer by, for example, solder as with the block terminals 86, for example. Thus, the conductor block 88 of the block terminal 86*b* is electrically connected to the corresponding ground layer. The pair of projection portions 881 is joined, together with the conductor block 88, to the corresponding ground layer by, for example, solder. The resist layer 89 is disposed on a principal surface of the conductor block 88 on an opposite side from the mount board 9 and has a plurality of cavities 891. In the block terminal 86*b*, the plurality of ground terminals 85 have one-to-one correspondence with the plurality of cavities 891 and are portions of the principal surface of the conductor block 88 that are exposed through the plurality of cavities 891.

In the radio frequency module 1, one block terminal 86 among the three block terminals 86 is located between the first switch 4 (antenna switch) and the low noise amplifier 21 in plan view in the thickness direction D1 of the mount board 9. However, the configuration is not limited to this, and two or more block terminals 86 may be located between the first switch 4 (antenna switch) and the low noise amplifier 21 in plan view in the thickness direction D1 of the mount board 9. In this case, the two or more block terminals 86 may be arranged in a direction that intersects with the direction in which the first switch 4 (antenna switch) and the low noise amplifier 21 are arranged, or may be arranged in the direction in which the first switch 4 (antenna switch) and the low noise amplifier 21 are arranged in plan view in the thickness direction D1 of the mount board 9. It is sufficient that the radio frequency module 1 includes at least one of the three block terminals 86.

The shape of each of the plurality of ground terminals 85 of the block terminal 86 is not limited to the columnar shape and may be pillar-like shape other than the columnar shape (for example, a square-pillar-like shape). The shape of each of the plurality of ground terminals 85 of the block terminal 86 is not limited to the pillar-like shape and may be, for example, a hemispherical shape. The radio frequency module 1 may include the block terminal 86 and the block terminal 86*b*.

The block terminal 86 has a thin long rectangular shape in plan view in the thickness direction D1 of the mount board 9. However, the shape is not limited to this, and the block terminal 86 may have, for example, an L-shape with which the block terminal 86 is disposed along two adjacent sides of the second principal surface 92 of the mount board 9 or a frame shape with which the block terminal 86 is disposed along the four sides. The radio frequency modules 1 and 1*a* may further include, in addition to the block terminals 86, the ground terminals 85 constituted by pillar-shaped electrodes disposed on the second principal surface 92 of the mount board 9.

The mount board 9 is not limited to the printed circuit board or the LTCC board, and may be, for example, an HTCC (High Temperature Co-fired Ceramics) board, a component-embedded printed circuit board, or the like.

The signal terminals for a radio frequency signal are not limited to the antenna terminal 81, the signal input terminal 82, and the signal output terminal 83. The signal terminals for a radio frequency signal may further include the external connection terminal 80 other than the antenna terminal 81, the signal input terminal 82, and the signal output terminal 83.

The second resin layer 102 of the radio frequency module 1 may be formed such that at least part of the second principal surface of the substrate of each of the plurality of second circuit elements 3 is exposed. The radio frequency module 1 includes the second resin layer 102. However, the configuration is not limited to this, and the radio frequency module 1 need not include the second resin layer 102. The layout of the plurality of second circuit elements 3 in plan view in the thickness direction D1 of the mount board 9 is not limited to the example of FIG. 1.

The radio frequency module 1 includes the first resin layer 101. However, the configuration is not limited to this, and the radio frequency module 1 need not include the first resin layer 101. The layout of the plurality of first circuit elements 2 in plan view in the thickness direction D1 of the mount board 9 is not limited to the example of FIG. 1. In the radio frequency module 1, an electronic component (radio frequency component) among the first circuit elements 2 may be mounted on the second principal surface 92 of the mount board 9 as one of the second circuit elements 3. In the radio frequency module 1, an electronic component (radio frequency component) among the second circuit elements 3 may be mounted on the first principal surface 91 of the mount board 9 as one of the first circuit elements 2.

The first switch 4, the second switch 5, the third switch 6, the fourth switch 7, and the low noise amplifier 21 may be constituted by different IC chips as in, for example, the radio frequency module 1 according the embodiment, or may be integrated into one chip in any combination.

It is sufficient that the number of selection terminals of each of the first switch 4, the second switch 5, the third switch 6, and the fourth switch 7 is plural, and the number of selection terminals is not limited to the illustrated number.

The radio frequency modules 1 and 1*a* may include a controller (power amplifier controller) that controls the power amplifier 11 in accordance with a control signal supplied from the signal processing circuit 301. The controller is, for example, a single IC chip including a substrate having a first principal surface (front surface) and a second principal surface (back surface) facing each other, and a control functional unit formed on the first principal surface side of this substrate.

The substrate of the power amplifier 11 is not limited to a gallium arsenide substrate and may be, for example, a silicon substrate. In this case, the transistor included in the power amplifier 11 is not the HBT but is a bipolar transistor.

The filter is not limited to a ladder filter and may be, for example, a longitudinally-coupled-resonator-type surface acoustic wave filter.

The filter described above is an acoustic wave filter that uses a surface acoustic wave. However, the filter is not limited to this and may be, for example, an acoustic wave filter that uses a boundary acoustic wave, a plate wave, or the like.

The filter may be an LC filter. In the case where the filter is an acoustic wave filter, the filter is able to improve attenuation characteristics around the pass band, compared with the case where the filter is an LC filter. In the case where the filter is an acoustic wave filter, the filter is able to increase Γ (reflection factor) in the mid-band, compared with the case where the filter is an LC filter.

Figure 6:
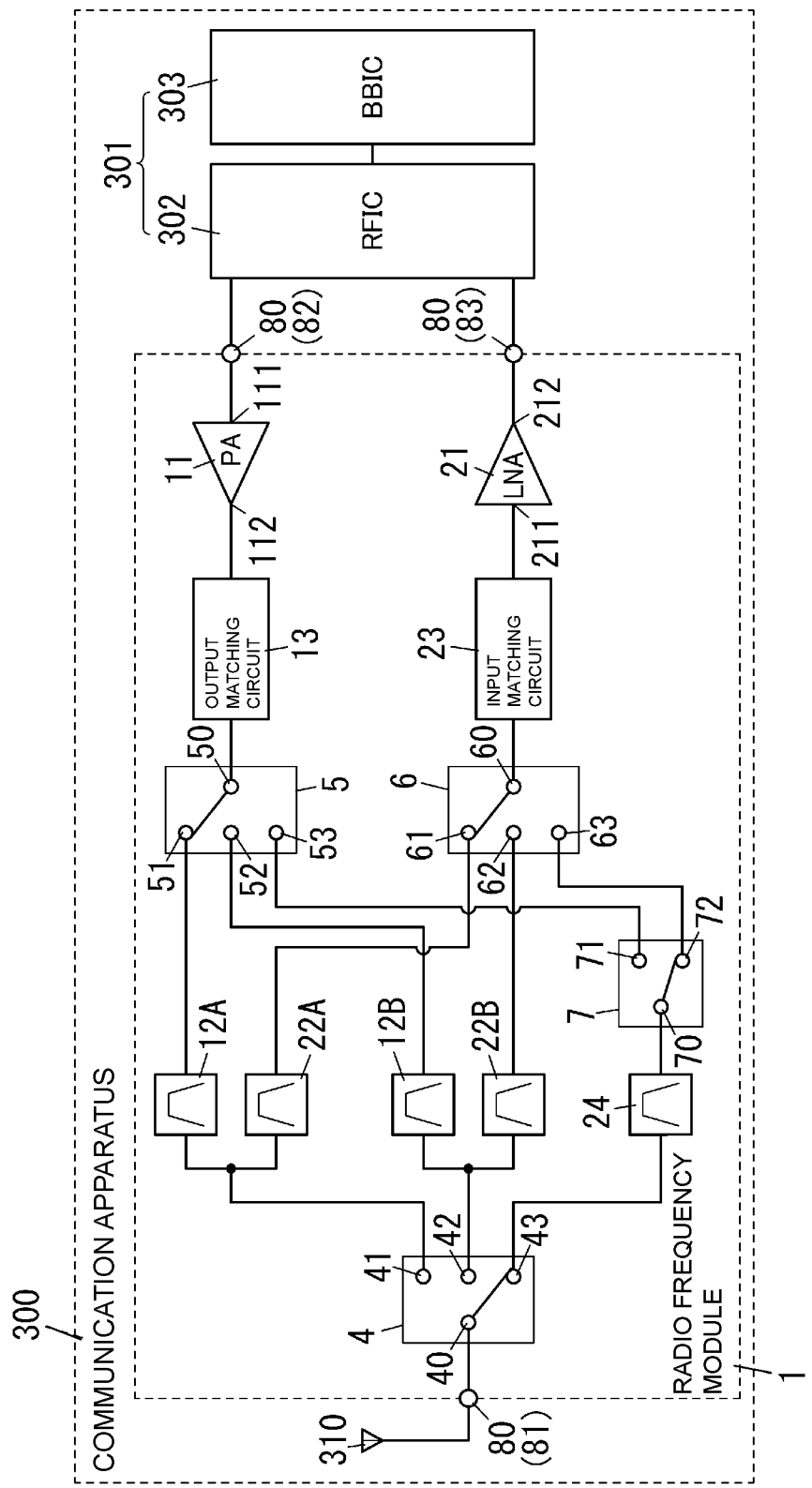
FIG. 6 is a diagram illustrating a circuit configuration of a communication apparatus including the same radio frequency module as the above.

The circuit configurations of the radio frequency modules 1 and 1*a* are not limited to the example illustrated in FIG. 6 described above. The radio frequency modules 1 and 1*a* may include, as the circuit configuration, a radio-frequency front-end circuit that supports MIMO (Multiple Input Multi Output), for example.

The communication apparatus 300 according to the embodiment may include the radio frequency module 1*a* instead of the radio frequency module 1.

(Aspects)

Aspects below are disclosed herein.

A radio frequency module (1; 1*a*) according to a first aspect includes a mount board (9), a first circuit element (2), a second circuit element (3), a signal terminal (an antenna terminal 81, a signal input terminal 82, or a signal output terminal 83) for a radio frequency signal, and a block terminal (86; 86*b*). The mount board (9) has a first principal surface (91) and a second principal surface (92) facing each other. The first circuit element (2) is mounted on the first principal surface (91) of the mount board (9). The second circuit element (3) is mounted on the second principal surface (92) of the mount board (9). The signal terminal (the antenna terminal 81, the signal input terminal 82, or the signal output terminal 83) is disposed on the second principal surface (92) of the mount board (9). The block terminal (86; 86*b*) is disposed on the second principal surface (92) of the mount board (9). The block terminal (86, 86*b*) includes a plurality of ground terminals (85).

The radio frequency module (1; 1*a*) according to the first aspect is capable of suppressing a change in potential at the ground terminals (85).

In a radio frequency module (1; 1*a*) according to a second aspect, in the first aspect, the signal terminal (the antenna terminal 81, the signal input terminal 82, or the signal output terminal 83) is a pillar-shaped electrode.

In the radio frequency module (1; 1*a*) according to the second aspect, the degree of freedom in arrangement of the signal terminal (the antenna terminal 81, the signal input terminal 82, or the signal output terminal 83) increases. Consequently, the degree of freedom in arrangement of the block terminal (86; 86*b*) increases.

In a radio frequency module (1; 1*a*) according to a third aspect, in the first or second aspect, the block terminal (86) has a base portion (87). The base portion (87) is disposed on the second principal surface (92) of the mount board (9). The plurality of ground terminals (85) protrude from the base portion (87) toward an opposite side from the second principal surface (92).

In a radio frequency module (1; 1*a*) according to a fourth aspect, in the first or second aspect, the block terminal (86*b*) includes a conductor block (88) and a resist layer (89). The conductor block (88) is disposed on the second principal surface (92) of the mount board (9). The resist layer (89) is disposed on a principal surface of the conductor block (88), the principal surface being on an opposite side from the mount board (9). The resist layer (89) has a plurality of cavities (891). The plurality of ground terminals (85) have one-to-one correspondence with the plurality of cavities (891) and are portions of the principal surface of the conductor block (88) that are exposed through the plurality of cavities (891).

In a radio frequency module (1; 1*a*) according to a fifth aspect, in any one of the first to fourth aspects, the radio frequency module (1; 1*a*) includes a plurality of the signal terminals, and a plurality of the second circuit elements (3). The plurality of signal terminals include an antenna terminal (81). The plurality of second circuit elements (3) include an antenna switch (the first switch 4) and a low noise amplifier (21). The antenna switch (the first switch 4) is electrically connected to the antenna terminal (81). The low noise amplifier (21) amplifies a radio frequency signal inputted via the antenna switch (the first switch 4) and outputs the amplified radio frequency signal. The block terminal (86; 86*b*) is located between the antenna switch (the first switch 4) and the low noise amplifier (21) in plan view in a thickness direction (D1) of the mount board (9).

In a radio frequency module (1; 1*a*) according to a sixth aspect, in any one of the first to fourth aspects, the radio frequency module (1; 1*a*) includes a plurality of the block terminals (86; 86*b*).

The radio frequency module (1; 1*a*) according to the sixth aspect is capable of suppressing a change in potential at the ground terminals (85).

In a radio frequency module (1; 1*a*) according to a seventh aspect, in the sixth aspect, the radio frequency module (1; 1*a*) includes a plurality of the signal terminals, and a plurality of the second circuit elements (3). The plurality of signal terminals include an antenna terminal (81). The plurality of second circuit elements (3) include an antenna switch (the first switch 4) and a low noise amplifier (21). The antenna switch (the first switch 4) is electrically connected to the antenna terminal (81). The low noise amplifier (21) amplifies a radio frequency signal inputted via the antenna switch (the first switch 4) and outputs the amplified radio frequency signal. At least one block terminal (86; 86*b*) among the plurality of block terminals (86; 86*b*) is located between the antenna switch (the first switch 4) and the low noise amplifier (21) in plan view in a thickness direction (D1) of the mount board (9).

The radio frequency module (1; 1*a*) according to the seventh aspect is capable of improving the isolation between the antenna switch (the first switch 4) and the low noise amplifier 21.

A communication apparatus (300) according to an eighth aspect includes the radio frequency module (1; 1*a*) according to any one of the first to seventh aspects, and a signal processing circuit (301). The signal processing circuit (301) performs signal processing on the radio frequency signal.

The communication apparatus (300) according to the eighth aspect is capable of suppressing a change in potential at the ground terminals (85).

1, 1a radio frequency module
2 first circuit element
3 second circuit element
4 first switch (antenna switch)
40 common terminal
41 to 43 selection terminal
5 second switch
50 common terminal
51 to 53 selection terminal
6 third switch
60 common terminal
61 to 63 selection terminal
7 fourth switch
70 common terminal
71, 72 selection terminal
12A, 12B transmission filter
11 power amplifier
111 input terminal
112 output terminal
13 output matching circuit
21 low noise amplifier
211 input terminal
212 output terminal
23 input matching circuit
22A, 22B reception filter
24 transmission-reception filter
80 external connection terminal
81 antenna terminal (signal terminal)
82 signal input terminal (signal terminal)
83 signal output terminal (signal terminal)
85 ground terminal
86, 86b block terminal
87 base portion
871 first principal surface
872 second principal surface
88 conductor block
881 projection portion
89 resist layer
891 cavity
9 mount board
91 first principal surface
92 second principal surface
93 outer peripheral surface
101 resin layer (first resin layer)
1011 principal surface
1013 outer peripheral surface
102 resin layer (second resin layer)
1021 principal surface
1023 outer peripheral surface
300 communication apparatus
301 signal processing circuit
302 RF signal processing circuit
303 baseband signal processing circuit
310 antenna

The invention claimed is:

1. A radio frequency module comprising:
a mount board having a first principal surface and a second principal surface facing each other;
a first circuit element mounted on the first principal surface of the mount board;
at least one second circuit element mounted on the second principal surface of the mount board;
at least one signal terminal, for a radio frequency signal, disposed on the second principal surface of the mount board; and
at least one block terminal disposed on the second principal surface of the mount board and including a plurality of ground terminals,
wherein the block terminal includes:
a conductor block disposed on the second principal surface of the mount board; and
a resist layer disposed on a principal surface of the conductor block, the principal surface being on an opposite side from the mount board, the resist layer having a plurality of cavities, and
wherein the plurality of ground terminals have one-to-one correspondence with the plurality of cavities and are portions of the principal surface of the conductor block exposed through the plurality of cavities.

2. The radio frequency module according to claim 1, wherein the signal terminal is a pillar-shaped electrode.

3. The radio frequency module according to claim 2, wherein
the block terminal has a base portion disposed on the second principal surface of the mount board, and
the plurality of ground terminals protrude from the base portion toward an opposite side from the second principal surface.

4. The radio frequency module according to claim 2, wherein
the block terminal includes
a conductor block disposed on the second principal surface of the mount board, and
a resist layer disposed on a principal surface of the conductor block, the principal surface being on an opposite side from the mount board, the resist layer having a plurality of cavities, and
the plurality of ground terminals have one-to-one correspondence with the plurality of cavities and are portions of the principal surface of the conductor block exposed through the plurality of cavities.

5. The radio frequency module according to claim 2, wherein
the signal terminal comprises a plurality of signal terminals,
the second circuit element comprises a plurality of second circuit elements,
the plurality of signal terminals include an antenna terminal,
the plurality of second circuit elements include
an antenna switch electrically connected to the antenna terminal, and
a low noise amplifier configured to amplify a radio frequency signal inputted via
the antenna switch and output the amplified radio frequency signal, and the block terminal is located between the antenna switch and the low noise amplifier in plan view in a thickness direction of the mount board.

6. The radio frequency module according to claim 2, wherein the block terminal comprises a plurality of block terminals.

7. A communication apparatus comprising:
the radio frequency module according to claim 2; and
a signal processing circuit configured to perform signal processing on the radio frequency signal.

8. The radio frequency module according to claim 1, wherein
the block terminal has a base portion disposed on the second principal surface of the mount board, and the plurality of ground terminals protrude from the base portion toward an opposite side from the second principal surface.

9. The radio frequency module according to claim 8, wherein
the signal terminal comprises a plurality of signal terminals,
the second circuit element comprises a plurality of second circuit elements,
the plurality of signal terminals include an antenna terminal,
the plurality of second circuit elements include
an antenna switch electrically connected to the antenna terminal, and
a low noise amplifier configured to amplify a radio frequency signal inputted via the antenna switch and output the amplified radio frequency signal, and
the block terminal is located between the antenna switch and the low noise amplifier in plan view in a thickness direction of the mount board.

10. The radio frequency module according to claim 8, wherein the block terminal comprises a plurality of block terminals.

11. A communication apparatus comprising:
the radio frequency module according to claim 8; and
a signal processing circuit configured to perform signal processing on the radio frequency signal.

12. The radio frequency module according to claim 1, wherein
the signal terminal comprises a plurality of signal terminals,
the second circuit element comprises a plurality of second circuit elements,
the plurality of signal terminals include an antenna terminal,
the plurality of second circuit elements include
an antenna switch electrically connected to the antenna terminal, and
a low noise amplifier configured to amplify a radio frequency signal inputted via the antenna switch and output the amplified radio frequency signal, and
the block terminal is located between the antenna switch and the low noise amplifier in plan view in a thickness direction of the mount board.

13. A communication apparatus comprising:
the radio frequency module according to claim 12; and
a signal processing circuit configured to perform signal processing on the radio frequency signal.

14. The radio frequency module according to claim 1, wherein the block terminal comprises a plurality of block terminals.

15. The radio frequency module according to claim 14, wherein
the signal terminal comprises a plurality of signal terminals,
the second circuit element comprises a plurality of second circuit elements,
the plurality of signal terminals include an antenna terminal,
the plurality of second circuit elements include
an antenna switch electrically connected to the antenna terminal, and
a low noise amplifier configured to amplify a radio frequency signal inputted via the antenna switch and output the amplified radio frequency signal, and
at least one block terminal among the plurality of block terminals is located between the antenna switch and the low noise amplifier in plan view in a thickness direction of the mount board.

16. A communication apparatus comprising:
the radio frequency module according to claim 1; and
a signal processing circuit configured to perform signal processing on the radio frequency signal.

* * * * *